United States Patent
Corfias-Zuccalli et al.

(10) Patent No.: US 8,916,642 B2
(45) Date of Patent: *Dec. 23, 2014

(54) USE OF A POLETHYLENE-BASED FILM IN A PHOTOVOLTAIC MODULE

(75) Inventors: Catherine Corfias-Zuccalli, Pont-Audemer (FR); Laurent B. Cartier, Wayne, PA (US); Samuel Devisme, Rouen (FR); Stephane Bizet, Barc (FR)

(73) Assignee: Arkema France, Colombes (FR)

( * ) Notice: Subject to any disclaimer, the term of this patent is extended or adjusted under 35 U.S.C. 154(b) by 114 days.

This patent is subject to a terminal disclaimer.

(21) Appl. No.: 13/139,340

(22) PCT Filed: Dec. 14, 2009

(86) PCT No.: PCT/FR2009/052517
§ 371 (c)(1),
(2), (4) Date: Sep. 1, 2011

(87) PCT Pub. No.: WO2010/067040
PCT Pub. Date: Jun. 17, 2010

(65) Prior Publication Data
US 2011/0303263 A1    Dec. 15, 2011

Related U.S. Application Data

(60) Provisional application No. 61/122,141, filed on Dec. 12, 2008.

(30) Foreign Application Priority Data

Feb. 6, 2009  (FR) ...................... 09 50736

(51) Int. Cl.
| | | |
|---|---|---|
| C08L 37/00 | (2006.01) | |
| C08L 23/06 | (2006.01) | |
| C08L 23/08 | (2006.01) | |
| C09D 123/08 | (2006.01) | |
| C09J 123/08 | (2006.01) | |
| H01L 31/048 | (2014.01) | |

(52) U.S. Cl.
CPC ............. *C08L 23/06* (2013.01); *C08L 23/0815* (2013.01); *C08L 23/0869* (2013.01); *C09D 123/0869* (2013.01); *C09D 123/0884* (2013.01); *C09J 123/0869* (2013.01); *C09J 123/0884* (2013.01); *H01L 31/0481* (2013.01); *H01L 31/0487* (2013.01); C08L 23/0884 (2013.01); Y02E 10/50 (2013.01)
USPC ............ 524/517; 524/522; 524/523; 524/531

(58) Field of Classification Search
CPC ................ C09J 123/0869; C09J 123/0884; C09D 123/0869; C09D 123/0884; C08L 23/06; C08L 23/0869; C08L 23/0815; H01L 31/0481; H01L 31/0487
USPC .................. 524/517, 522, 523, 531
See application file for complete search history.

(56) References Cited

U.S. PATENT DOCUMENTS

| | | |
|---|---|---|
| 5,478,402 A | 12/1995 | Hanoka |
| 5,849,846 A * | 12/1998 | Chen et al. ............ 525/166 |
| 6,099,685 A | 8/2000 | Ito et al. |
| 6,114,046 A | 9/2000 | Hanoka |
| 6,187,448 B1 | 2/2001 | Hanoka et al. |
| 6,201,066 B1 | 3/2001 | Ito et al. |
| 6,414,236 B1 | 7/2002 | Kataoka et al. |
| 6,437,046 B1 * | 8/2002 | Morris ................. 525/191 |
| 6,482,530 B2 | 11/2002 | Ito et al. |
| 7,338,707 B2 | 3/2008 | Kernander et al. |
| 7,579,083 B2 | 8/2009 | Kernander et al. |
| 7,901,779 B2 | 3/2011 | Kernander et al. |
| 2005/0047402 A1 | 3/2005 | Bostrom |
| 2005/0172997 A1 | 8/2005 | Meier et al. |
| 2005/0247402 A1 * | 11/2005 | Fujiki et al. ............. 156/273.3 |
| 2005/0268961 A1 | 12/2005 | Hetzler et al. |
| 2007/0012352 A1 | 1/2007 | Wohlgemuth et al. |
| 2008/0099064 A1 * | 5/2008 | Hayes ................. 136/251 |
| 2009/0203853 A1 * | 8/2009 | Fujita et al. .............. 526/75 |

FOREIGN PATENT DOCUMENTS

JP          2006032308          2/2006

* cited by examiner

*Primary Examiner* — Peter D Mulcahy
(74) *Attorney, Agent, or Firm* — Thomas F. Roland

(57) ABSTRACT

The invention relates to the use in a photovoltaic module of a film of a composition as a backsheet or as an encapsulant, this composition comprising, with respect to the total weight of the composition: from 1 to 99% of a polyethylene having an ethylene whose level by weight is greater than or equal to 80% chosen from the homopolymers of ethylene and the copolymers of ethylene and another alpha-olefin; from 99 to 1% of a polyolefin B, other than A, carrying a reactive functional group X chosen from the anhydride carboxylic acids and epoxides. The invention further relates to a photovoltaic module comprising the film of the composition according to the invention and also a process for the manufacture of this module.

15 Claims, 2 Drawing Sheets

Figure 3:
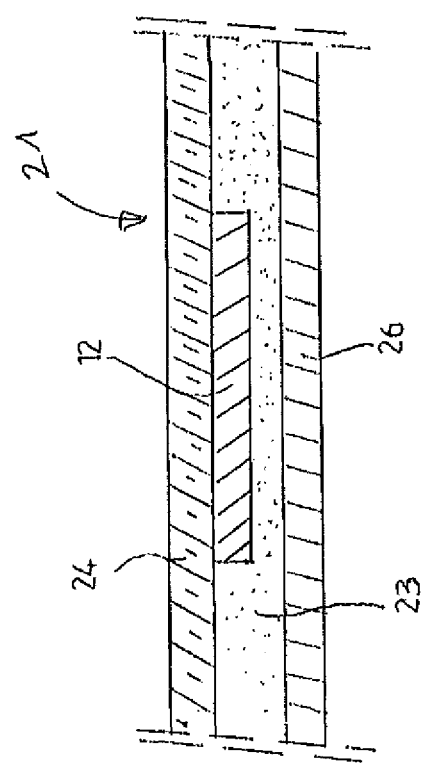

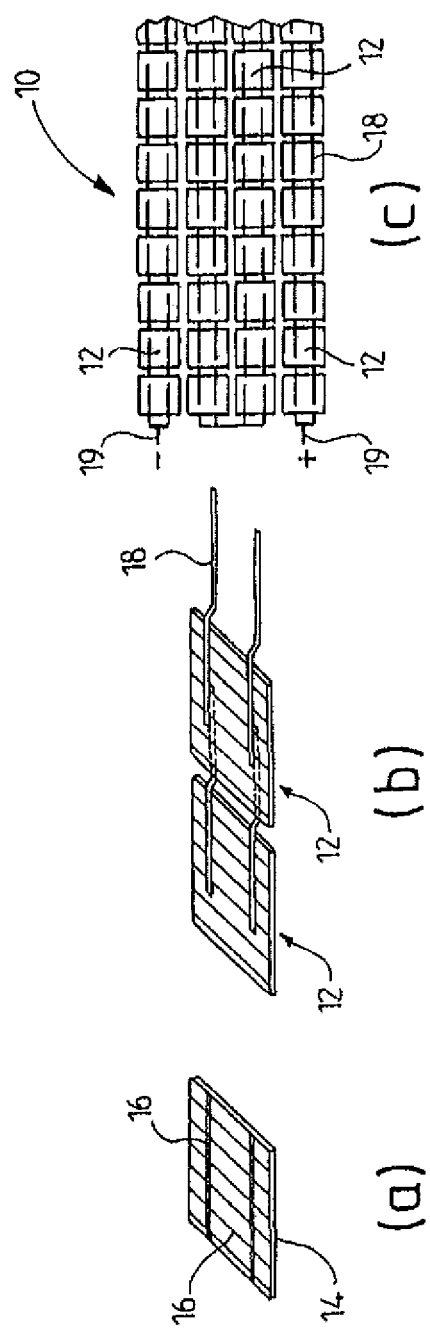
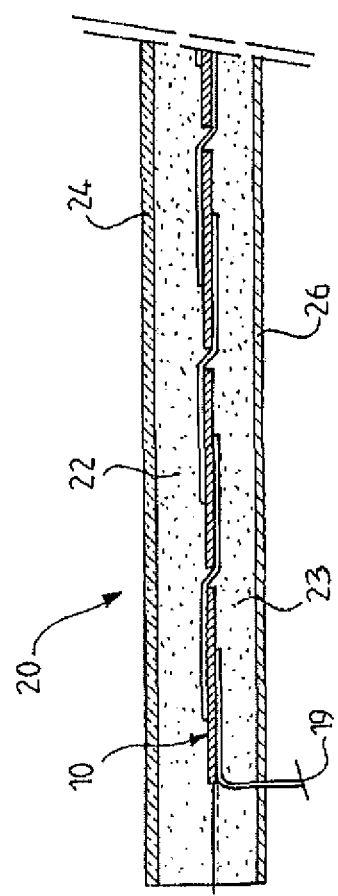
FIG. 1
FIG. 2

USE OF A POLETHYLENE-BASED FILM IN A PHOTOVOLTAIC MODULE

FIELD OF THE INVENTION

A subject-matter of the invention is a film of a composition comprising a blend of a polyolefin chosen from homopolymers of ethylene and copolymers of ethylene with another alpha-olefin and a second polyolefin. The invention relates also to the use thereof in photovoltaic modules.

The invention also relates to the photovoltaic module comprising the film of this composition.

Another subject-matter of the invention is a process for the manufacture of this module and the use of the module for producing electricity.

Global warming, linked to the greenhouse gases given off by fossil fuels, has led to the development of alternative energy solutions which do not emit such gases during their operation, such as, for example, photovoltaic modules. A photovoltaic module comprises a "photovoltaic cell", this cell being capable of converting light energy into electricity.

Numerous types of photovoltaic panel structure exist.

A conventional photovoltaic cell has been represented in FIG. 1; this photovoltaic cell (10) comprises cells (12), one cell comprising a photovoltaic sensor (14), generally based on silicon treated in order to obtain photoelectric properties, in contact with electron collectors (16) placed above (upper collectors) and below (lower collectors) the photovoltaic sensor. The upper collectors (16) of one cell are connected to the lower collectors (16) of another cell (12) via conducting bars (18), generally composed of an alloy of metals. All these cells (12) are connected to one another, in series and/or in parallel, to form the photovoltaic cell (10). When the photovoltaic cell (10) is placed under a light source, it delivers a continuous electric current, which can be recovered at the terminals (19) of the cell (10).

With reference to FIG. 2, the photovoltaic module (20) comprises the photovoltaic cell (10) of FIG. 1 encased in an "encapsulant", the latter being composed of an upper part (22) and of a lower part (23). An upper protective layer (24) and a protective layer (26) at the back of the module (known under the term "backsheet") are positioned on either side of the encapsulated cell.

The encapsulant (22) and (23) has to perfectly match the shape of the space existing between the photovoltaic cell (10) and the protective layers (24) and (26) in order to avoid the presence of air, which would limit the output of the photovoltaic module. The encapsulant (22) and (23) must also prevent contact of the cells (12) with atmospheric oxygen and water in order to limit the corrosion thereof. The upper part (22) of the encapsulant is included between the cell (10) and the upper protective layer (24). The lower part (23) of the encapsulant is included between the cell (10) and the backsheet (26).

Impact and moisture protection of the photovoltaic cell (10) is provided by the upper protective layer (24), generally made of glass.

The backsheet (26), for example a multilayer film based on fluoropolymer and on polyethylene terephthalate, contributes to the moisture protection of the photovoltaic module (20) and to the electrical insulation of the cells (12) in order to prevent any contact with the external environment.

More recently, thin-layer photovoltaic modules have been developed, as described, for example, in Application WO 99/04971. A possible representation of this type of module has been represented in FIG. 3. This alternative form of photovoltaic panel (21) is composed of a thin layer of a semiconducting material which constitutes the photovoltaic sensor (12) on the protective sheet (24). In this case, there is no encapsulant between the sensor and the upper protective layer; the encapsulant is then composed solely of a lower part (23). A backsheet (26) completes the structure of the photovoltaic panel.

STATE OF THE ART

In order to form a photovoltaic module, the various layers (photovoltaic cell, upper protective layer, encapsulant, backsheet) must adhere to their various interfaces: otherwise, gases or water infiltrate the interior of the module, which reduces the output of the module and causes premature ageing thereof.

One possible solution is to use a layer of adhesive or tie between the various layers. Mention may be made, for example, of Application WO 2004/091901, which describes a backsheet structure for photovoltaic modules in which an adhesive based on polyester or on polyurethane is included between a layer of an ethylene/vinyl acetate (EVA) copolymer and a layer of a barrier polymer, in order to make possible the adhesion of these two layers.

Another solution is to use an encapsulant, some examples of which will be described in the continuation of the state of the art of the present description, this encapsulant having to adhere to the upper protective layer, the backsheet and the photovoltaic cell.

In the presence of solar radiation, heating occurs inside the photovoltaic module and temperatures of 70° C. (or more) may be achieved. The thermomechanical properties, in particular the creep strength, of the adhesive, of the tie or of the encapsulant therefore have to be retained at these temperatures in order for the module not to be deformed. The creep strength is more particularly important in the case of the encapsulant: this is because, in the event of creep, the cell may come into contact with air and/or the upper and/or the lower protective layers, which results in a decline in the output of a photovoltaic module, indeed even damage to the photovoltaic cell and module.

The encapsulant has to exert an adhesiveness after manufacture of the photovoltaic panel in order to prevent delamination of the various layers, have a good creep strength at the temperatures at which the photovoltaic panel is used, exhibit a good electrical resistivity, in order to avoid any short circuit, and have good resistance to light. Furthermore, in order not to reduce the output of the photovoltaic module, it is necessary for the upper part of the encapsulant to make possible the transmission of the light waves of solar radiation to the cells, that is to say for it to be transparent. However, the lower part of the encapsulant may not be transparent.

As regards the encapsulants in the photovoltaic modules, the use of ethylene/vinyl acetate (EVA) copolymer, for example described in Application JP19870174967, currently constitutes the most widespread solution. EVA has good transparency. However, it decomposes under the influence of solar radiation and temperature; release of acetic acid, which corrodes photovoltaic cells, is then observed. Moreover, ageing of the encapsulant over time is also observed, which is marked in particular by significant yellowing, resulting in a reduction in the output of the photovoltaic module.

In addition, the creep strength of the EVA is not sufficient under the conditions of use of photovoltaic modules. It is therefore necessary for this copolymer to be crosslinked, often by peroxides; it is therefore no longer thermoplastic.

Furthermore, its adhesion to the protective layers is not satisfactory and adhesion-promoting agents, commonly known as "coupling agents", therefore have to be added. These agents are products generally chosen from organic titanates or silanes.

The presence of these coupling agents on a significant scale may be problematical for the process for the manufacture of the photovoltaic modules. This is because the various layers of the module are generally assembled by laminating and the assembling of the various layers forming the photovoltaic module is generally carried out by vacuum drawing. This vacuum drawing is provided via a silicone membrane which is flattened against the photovoltaic module. In point of fact, when placed under vacuum, the coupling agents, which are volatile, are sucked up and are deposited on the membrane. In point of fact, the silicone decomposes on contact with the coupling agents; it is therefore necessary to dispense with them or to limit their use therein in order to make possible the use of this silicone membrane over a longer period of time for the manufacture, in series, of several photovoltaic modules.

In order to solve the problems of thermomechanical properties of the encapsulant, in particular of creep strength, the use, as encapsulant, of an ionomer in photovoltaic modules is described in the document WO 95/22843. This ionomer is a noncrosslinked thermoplastic copolymer of ethylene and of (meth)acrylic acid partially neutralized with cations of elements of Groups I, II or III of the Periodic Table (for example, of zinc or calcium cation). These ionomers also exhibit, to the naked eye, good transparency. However, although the thermomechanical properties are better than those of noncrosslinked EVA, the creep strength is not satisfactory. This is because the formation of an ionic lattice allows the ionomer to retain a degree of cohesion above its melting point but without its creep strength being entirely satisfactory. Another major problem of the ionomer is its high viscosity at the normal temperatures of manufacture of the photovoltaic modules (generally included in the range extending from 120° C. to 160° C.). In point of fact, this high viscosity is a curb on the productive output: this is because, in a continuous film manufacturing process, for example an extrusion manufacturing process, the film delivery at the extruder outlet decreases when the viscosity increases.

In addition, the document WO 99/04971 describes a multilayer encapsulating material comprising at least two layers of an ethylene-methacrylic acid copolymer with an intermediate layer of metallocene polyethylene. This multilayer material has to be manufactured by coextrusion, which requires specific processing means which render its manufacturing process complex.

Moreover, in U.S. Pat. No. 6,414,236, the encapsulant is an ethylene-fatty acid unsaturated ester-unsaturated fatty acid terpolymer. This encapsulant is intended to improve the resistance to ageing of the photovoltaic module. However, its creep strength remains mediocre and it therefore has to be crosslinked: the encapsulant is therefore no longer thermoplastic. In the examples, all the formulations comprise peroxides for crosslinking the compositions.

The application JP-A-2006/032308 relates to an electrodes separator used in sensitive cells of a certain type, of the Gratzel type, these cells comprising an electrolyte liquid. This separator is in contact with this electrolyte liquid and must therefore have a good resistance to this liquid. The composition of the separator is not used as an encapsulant film or backsheet.

As regards the backsheet, it has to confer, on the photovoltaic module, impermeability to moisture, good creep strength and also good tear strength (that is to say, that a film produced from the composition has to exhibit good mechanical strength). Multilayer films based on fluoropolymer (such as polyvinyl fluoride PVF or polyvinylidene fluoride PVDF) and/or on polyester, such as polyethylene terephthalate (PET), are generally concerned.

For example, Application US 2005/0172997 describes a photovoltaic module, the backsheet of which is a PVF film.

Application US 2005/0268961 for its part describes a photovoltaic cell protected by a film comprising two layers of fluoropolymer, one having a melting point of greater than 135° C. and the other having a melting point of less than 135° C.

Mention may also be made of Application WO 2007/011580, which describes polyester-based films for the back panel of a photovoltaic cell. A PVF layer can be used in combination with the polyester film.

It is therefore still necessary to find novel photovoltaic modules. More particularly, it is necessary to find films which can be used in the modules as encapsulant and/or backsheet. These films must exhibit good adhesion to the other layers of the module and must exhibit satisfactory properties of thermomechanical stability at the temperature of manufacture of the photovoltaic module, of resistance to UV radiation, of resistance to heat and of permeability to water vapour, and electrical properties.

SUMMARY OF THE INVENTION

In fact, a subject-matter of the invention is the use in a photovoltaic module of a film of a composition as a backsheet or as an encapsulant, this composition comprising, with respect to the total weight of the composition:

from 1 to 99% of a polyethylene having an ethylene whose level by weight is greater than or equal to 80% chosen from the homopolymers of ethylene and the copolymers of ethylene and another alpha-olefin;

from 99 to 1% of a polyolefin B, other than A, carrying a reactive functional group X chosen from the anhydride carboxylic acids and epoxides.

The composition according to the invention combines satisfactory properties of electrical insulation, of barrier to water, of adhesion and of creep strength at temperatures of use of the order of 100° C., and even more, even without crosslinking and without coupling agents; these favourable properties make possible its advantageous use in the film form, as encapsulant, in photovoltaic modules. Furthermore, the composition used in the invention exhibits better resistance to light and to UV radiation in comparison with EVA. Another advantage of the composition is its low viscosity in comparison with the ionomers at the temperature generally used for the manufacture of photovoltaic panels which facilitates its processing and the productive output of the structures according to the invention. Preferably, this composition will be used in the lower part of the encapsulant.

This composition also exhibits properties of barrier to water, of creep strength at temperatures of use of the order of 100° C., indeed even more, and of tear strength which allow it to be used as backsheet. Moreover, the costs of manufacture of films from this composition based on polyolefins is much less than that of the backsheet films based on fluoropolymers normally used.

To our knowledge, there does not currently exist a technical solution which allows a polyolefin-based film of the same composition to be used as encapsulant and backsheet. One of the advantages of the present invention is that it allows just the one film to be used as encapsulant (lower part) and backsheet, it being possible for this film to be monolayer.

Preferably, the other polyolefin of the polyethylene A is chosen from the propylene, 1-butene, 1-hexene, 1-octene or 1-decene.

Preferably, the composition comprises from 10 to 75% by weight of polyethylene A, with respect to the total weight of the composition, more preferably still from 15 to 60% by weight.

According to a first preferred form of the invention, the functional group X is a carboxylic acid anhydride functional group, preferably a maleic anhydride functional group.

According to a second preferred form of the invention, the functional group X is an epoxide functional group, preferably glycidyl methacrylate.

Advantageously, the polyethylene A comprises a level by weight of α-olefin of greater than or equal to 90%. Preferably, the polyethylene A comprises a level by weight greater than or equal to 90% of ethylene.

Advantageously, the polyethylene A has a density greater to 0.92, preferably greater to 0.93.

According to an alternative form of the invention, the polyolefins of the composition are composed of the polyethylene A and of polyolefin B.

The polyolefin B preferably comprises ethylene.

Advantageously, the polyolefin B carrying the functional group X is an ethylene-alkyl(meth)acrylate-maleic anhydride copolymer.

Advantageously, the polyolefin B carrying the functional group X is an ethylene-glycidyl(meth)acrylate copolymer.

The composition can additionally comprise at least one of the additives chosen from coupling agents, crosslinking agents, UV absorbents, inorganic fillers, plasticizers, colouring materials, optical brighteners and flame retardants.

According to one form of the invention, the composition is used as encapsulant and backsheet.

The invention also relates to a photovoltaic module which comprises the film of the composition.

The module can particularly be manufactured according to a process comprising:
    a stage of manufacturing a film of the composition;
    a stage of assembling the various constituents of the module with the said manufactured film as encapsulant and/or backsheet.

Advantageously, for this process, the stage of manufacturing the film is carried out by extrusion at a temperature ranging from 115 to 300° C., preferably at a temperature ranging from 115 to 150° C.

The invention also relates to the use of the photovoltaic module according to the invention for producing electricity.

DESCRIPTION OF THE APPENDED FIGURES

The description of the Figures which will follow is given solely by way of illustration and without implied limitation with reference to the appended Figures, in which:

FIG. 1, already described, represents an example of a conventional photovoltaic cell, the parts (a) and (b) being ¾ views, the part (a) showing a cell before connection and the part (b) a view after connecting 2 cells; the part (c) is a top view of a complete photovoltaic cell.

FIG. 2, already described, represents a cross section of a photovoltaic module, the "conventional" photovoltaic sensor of which is encapsulated by an upper encapsulant film and a lower encapsulant film.

FIG. 3, already described, represents a cross section of a photovoltaic module, the photovoltaic sensor of "thin layer" type of which deposited on the upper protective layer is encapsulated with a lower encapsulant film.

DETAILED DESCRIPTION OF THE INVENTION

The invention relates to the use in a photovoltaic module of a film of a composition as a backsheet or as an encapsulant, this composition comprising, with respect to the total weight of the composition:
    from 1 to 99% of a polyethylene having an ethylene whose level by weight is greater than or equal to 80% chosen from the homopolymers of ethylene and the copolymers of ethylene and another alpha-olefin;
    from 99 to 1% of a polyolefin B, other than A, carrying a reactive functional group X chosen from the anhydride carboxylic acids and epoxides.

The term "polyolefin" is used to describe polymers comprising an α-olefin as monomer.

According to the invention, when a polymer comprises a monomer (or a comonomer), this means that this monomer (or this comonomer) is polymerized in the polymer chain and it is no longer in the monomer form.

The polyethylene A, which is a polyolefin, is a polyethylene chosen from the homopolymers and the copolymer from ethylene and another alpha-olefin having a level by weight of alpha-olefin, for instance of ethylene, of greater than or equal to 80%. Preferably, the other alpha-olefin of the polyethylene A has from 3 to 30 carbon atoms.

It is preferable for the α-olefins of the polyolefin B to have from 2 to 30 carbon atoms.

Mention may be made, as α-olefin, of ethylene, propylene, 1-butene, 1-pentene, 3-methyl-1-butene, 1-hexene, 4-methyl-1-pentene, 3-methyl-1-pentene, 1-octene, 1-decene, 1-dodecene, 1-tetradecene, 1-hexadecene, 1-octadecene, 1-eicosene, 1-docosene, 1-tetracosene, 1-hexacosene, 1-octacosene and 1-triacontene. Propylene and very especially ethylene are preferred as α-olefin.

A polyolefin can be a homopolymer when just one α-olefin is polymerized in the polymer chain.

These polyolefins can also be a copolymer when at least two comonomers are copolymerized in the polymer chain. One of the comonomers is an α-olefin; the other comonomer or the other comonomers are monomers capable of polymerizing with the α-olefin.

According to the invention, the term "copolymer" means a copolymer of an α-olefin with at least one comonomer resulting from the polymerization of this α-olefin and this (these) comonomer(s), if appropriate in combination with one or more other comonomers.

Mention may be made, as comonomer capable of polymerizing with an α-olefin, of:
    one of the α-olefins already mentioned, this α-olefin being other than the first α-olefin comonomer;
    dienes, such as, for example, 1,4-hexadiene, ethylidenenorbornene or butadiene;
    unsaturated carboxylic acid esters, such as, for example, alkyl acrylates or alkyl methacrylates combined under the term alkyl(meth)acrylates. The alkyl chains of these (meth)acrylates can have up to 30 carbon atoms. Mention may be made, as alkyl chains, of methyl, ethyl, propyl, n-butyl, sec-butyl, isobutyl, tert-butyl, pentyl, hexyl, heptyl, octyl, 2-ethylhexyl, nonyl, decyl, undecyl, dodecyl, tridecyl, tetradecyl, pentadecyl, hexadecyl, heptadecyl, octadecyl, nonadecyl, eicosyl, hencosyl, docosyl, tricosyl, tetracosyl, pentacosyl, hexacosyl, heptacosyl, octacosyl or nonacosyl. Preference is given to methyl, ethyl and butyl(meth)acrylates as unsaturated carboxylic acid esters;

the unsaturated carboxylic acids and their salts;

carboxylic acid vinyl esters. Mention may be made, as examples of carboxylic acid vinyl esters, of vinyl acetate, vinyl versatate, vinyl propionate, vinyl butyrate or vinyl maleate. Vinyl acetate is preferred as carboxylic acid vinyl ester.

The polyethylene A advantageously comprises a level by weight of α-olefin of greater than or equal to 90%, preferably of greater than 95%. Preferably, the polyethylene A comprises a level by weight of greater than or equal to 90% of ethylene, more preferably greater than 95%.

The polyethylene A is advantageously a medium density or high-density polyethylene, that is to say that the density of the polyethylene (measured according to Standard ASTM D 1505) is greater than 0.92. Preferably, the density is greater than 0.93. Its melting point is preferably greater than or equal to 105° C., more preferably greater than or equal to 110° C., very preferably greater than or equal to 115° C. This temperature is measured by DSC according to Standard ISO 11357-03.

The polyolefin B carries a functional group X. It is possible to choose, as comonomer carrying the functional group X, from:

unsaturated carboxylic acid anhydrides, unsaturated epoxides.

The comonomers carrying a carboxylic acid anhydride functional group can be chosen, for example, from maleic, itaconic, citraconic, allylsuccinic, cyclohex-4-ene-1,2-dicarboxylic, 4-methylenecyclohex-4-ene-1,2-dicarboxylic, bicyclo[2.2.1]hept-5-ene-2,3-dicarboxylic and x-methylbicyclo [2.2.1]hept-5-ene-2,2-dicarboxylic anhydrides.

Mention may be made, among comonomers carrying an epoxide functional group (unsaturated epoxides), of aliphatic glycidyl esters and ethers, such as allyl glycidyl ether, vinyl glycidyl ether, glycidyl maleate, glycidyl itaconate, glycidyl acrylate and glycidyl methacrylate. They are also, for example, alicyclic glycidyl esters and ethers, such as 2-cyclohexen-1-yl glycidyl ether, glycidyl cyclohexene-4,5-dicarboxylate, glycidyl cyclohexene-4-carboxylate, glycidyl 5-norbornene-2-methyl-2-carboxylate and diglycidyl endo-cis-bicyclo[2.2.1]hept-5-ene-2,3-dicarboxylate.

Preference is given to carboxylic acid anhydrides as functional group X (particularly maleic anhydride) and to epoxides (particularly glycidyl methacrylate).

The polyolefin B comprises at least 45% by weight of α-olefin, preferably within the range extending from 60% to 99%, with respect to the total weight of the polyolefin B.

The polyolefin B can comprise up to 40% by weight of comonomer, other than the α-olefin, not carrying a functional group X, with respect to the total weight of the polyolefin B, for example from 1 to 35%, preferably less than 20% and very preferably less than 15%.

Preferably, the polyolefin B is a polymer comprising alkyl (meth)acrylate. Preference is given to alkyl(meth)acrylates having an alkyl chain comprising from 1 to 4 carbon atoms, preferably methyl, ethyl or butyl.

The polyolefin B can, for example, comprise up to 15% by weight of comonomer carrying a functional group X, preferably from 0.1% to 10% by weight, very preferably from 0.5% to 5% by weight, with respect to the total weight of the polyolefin B.

According to one form of the invention, the polyolefin B is a random copolymer of ethylene and of maleic anhydride or a random copolymer of ethylene, of alkyl(meth)acrylate and of maleic anhydride.

According to another form of the invention, the polyolefin B is a random copolymer of ethylene and of glycidyl methacrylate or a random copolymer of ethylene, of alkyl(meth) acrylate and of glycidyl methacrylate.

The polyethylene A can be a copolymer of ethylene and of α-olefin, such as, for example, propylene, 1-butene, 1-hexene, 1-octene or 1-decene.

The monomers or comonomers can be polymerized by known polymerization techniques. The polymerization can, for example, be carried out by radical polymerization processes at high pressure in an autoclave reactor or in a tubular reactor, which are techniques known to a person skilled in the art. Mention may be made, for example, of Patent GB 1 090 823. Other copolymerization processes which can be used are, for example, those described in US 2006/0149004 A1 or in US 2007/0032614 A1.

Use may also be made of a polymerization carried out by Ziegler-Natta or metallocene catalysis.

For the polyethylene A, it is preferable for this to be a metallocene polyethylene. The term "metallocene polyethylene" is understood to mean a polyethylene obtained by using a metallocene catalyst, that is to say in the presence of a single-site catalyst generally composed of an atom of a metal which can, for example, be zirconium or titanium and of two cyclic alkyl molecules bonded to the metal. More specifically, the metallocene catalysts are usually composed of two cyclopentadiene rings bonded to the metal. These catalysts are frequently used with aluminoxanes as cocatalysts or activators, preferably methylaluminoxane (MAO). Hafnium can also be used as metal to which cyclopentadiene is attached. Other metallocenes can include transition metals from Groups IVA, VA and VIA. Metals of the lanthanide series can also be used.

The polyethylene is preferably characterized by a ratio $\overline{Mw}/\overline{Mn}<5$, for instance <3, and preferably <2, in which $\overline{Mw}$ and $\overline{Mn}$ respectively denote the weight-average molar mass and the number-average molar mass, or has an MFR (Melt Flow Ratio) of less than 6.53 and a ratio $\overline{Mw}/\overline{Mn}$ greater than MFR minus 4.63 (MFR denotes the ratio of the $MFI_{10}$ (MFI under a load of 10 kg) to the $MFI_2$ (MFI under a load of 2.16 kg)) or has an MFR equal to or greater than 6.13 and a ratio $\overline{Mw}/\overline{Mn}$ less than or equal to MFR minus 4.63.

The comonomer which carries a functional group X can be either grafted to the polyolefin or can be copolymerized with the other comonomers in order to obtain the polyolefin.

The comonomer which carries a functional group X can be grafted to the polyolefin using techniques well known to a person skilled in the art, for example the solution grafting process or the reactive extrusion process.

Preferably, the comonomer carrying a functional group X is copolymerized with the other comonomers.

Among the polyolefins B which have just been described, the composition according to the invention may in particular mention the copolymers sold under the Lotader® trademark by the Applicant Company.

Preferably, the composition comprises from 5 to 95% of polyethylene A, with respect to the total weight of the composition, preferably from 10 to 60% of polyethylene A, for example from 20 to 40%. Advantageously, the composition comprises respectively from 95 to 5% of polyolefin B with regard to composition total weight, preferably from 90 to 40% of polyethylene A, for instance from 80 to 60%.

The composition advantageously has an MFI within the range extending from 0.1 to 80 g/10 min (ASTM D1238, 190° C., 2.16 kg) and preferably from 0.5 to 50 g/10 min. A person skilled in the art can easily choose the MFI of the composition by selecting the amount of each component of the composition, the ratio of the various comonomers of the various polyolefins A and B and also the molar masses of these polyolefins.

Although the composition has adhesiveness even in the absence of coupling agents, coupling agents can be added in order to improve the adhesiveness of the composition when the adhesiveness has to be particularly high. The coupling agent can be organic, inorganic and more preferably semi-inorganic, semi-organic. Mention may be made, among these, of organic titanates or silanes, such as, for example, monoalkyl titanates, trichlorosilanes and trialkoxysilanes. The composition can comprise up to 20% by weight of coupling agents, with respect to the total weight of the composition, preferably from 0.1 to 10%, for instance from 0.1 to 1%.

Although the presence of crosslinking agents is not compulsory, this presence is possible in order to further improve the thermomechanical properties of the encapsulant and/or of the backsheet, in particular when the temperature becomes very high. Mention may be made, as examples, of organic peroxides or isocyanates. This crosslinking can also be carried out by known irradiation techniques.

As UV radiation results in yellowing of the composition, UV stabilizers can be added in order to improve its lifetime. These stabilizers can, for example, be based on benzophenone or on benzotriazole. They can be added in amounts of less than 10% by weight of the total weight of the composition and preferably from 0.1 to 5%, for instance from 0.1 to 1%.

Examples which will be given among fillers are silica, alumina, calcium carbonates, clays or carbon nanotubes.

Plasticizers can be added in order to facilitate the processing and to improve the productive output of the process for the manufacture of the composition and films. Mention may be made, as examples, of paraffinic, aromatic or naphthalenic mineral oils, which also make it possible to improve the adhesiveness of the composition according to the invention. Mention may also be made, as plasticizer, of phthalates, azelates, adipates or tricresyl phosphate.

Flame retardants can also be added.

Colouring or brightening compounds can also be added.

The composition according to the invention can be obtained by blending the various polyolefins with the optional additives using the known techniques for blending thermoplastics, such as, for example, extrusion or kneading. Use may be made of internal blade or rotor mixers, an external mixer, or single-screw or corotating or counterrotating twin-screw extruders. What is commonly known as a "compound" is then obtained.

The invention also relates to a film of the composition according to the invention. The thickness of the film according to the invention is advantageously within the range extending from 50 μm to 20 mm.

It is preferable to use a film having a thickness ranging from 50 μm to 20 mm if it is desired to use it as encapsulant, preferably from 75 μm to 10 mm, very preferably from 100 μm to 1 mm. However, as the composition does not have transparency properties which are as satisfactory as those of EVA, it is preferable to use a film of the composition as lower encapsulant. On the other hand, this composition exhibits excellent properties of adhesion to the upper protective layer (for example made of glass or of PMMA). It also exhibits excellent adhesion to polyolefins, particularly to compositions comprising ethylene-based copolymers, such as EVA, which can be used, for example, as upper encapsulant.

It is preferable to use a film having a thickness ranging from 0.2 mm to 20 mm if it is desired to use it as backsheet or encapsulant and backsheet, preferably from 0.5 mm to 10 mm.

The film can be monolayer or multilayer. When it is multilayer, the composition can be combined with the layers of polymers conventionally used in the photovoltaic field, such as polyolefins, especially EVA, ionomers or fluoropolymers.

A film according to the invention can be obtained from the composition according to the invention by conventional techniques of pressing, tubular (bubble) extrusion-blow moulding, extrusion-laminating, extrusion-coating or flat sheet extrusion (also known as extrusion-casting) or also by calendering. It would not be departing from the scope of the invention if the film according to the invention were obtained directly without passing through the compounding stage.

Generally, in order to obtain a photovoltaic module, a first lower layer of encapsulant, a photovoltaic cell, a second upper layer of encapsulant and then an upper protective layer are successively placed on a backsheet. For photovoltaic modules with thin-layer sensors, it is possible to have, for example, the structure as described in FIG. 3. Additional layers can in addition be found between these layers, in particular layers of ties or adhesives. These various layers are assembled in order to form the module.

One of the problems observed in the modules of the prior art is the delaminating at the backsheet/lower encapsulant interface due to poor adhesion between the said supports. If the adhesion is excellent between the backsheet and the encapsulant, it is also possible to observe delaminating of the backsheet layers.

According to the invention, it is possible to use a film of the composition as backsheet or as encapsulant. According to a highly advantageous form, the structure is used as encapsulant and backsheet, which solves the abovementioned problems of delaminating and simplifies the process for the manufacture of the photovoltaic modules.

It is specified that the photovoltaic modules according to the invention can be composed of any photovoltaic structure comprising the composition according to the invention and are very obviously not limited to those described in the Figures of the present description.

Use may be made, to form the photovoltaic cell, of any type of photovoltaic sensor including "conventional" sensors based on monocrystalline or polycrystalline doped silicon; thin-layer sensors formed, for example, of amorphous silicon, cadmium telluride, copper indium disilenide or organic materials can also be used.

The protective sheet has abrasion- and impact-resistant properties, is transparent and protects the photovoltaic sensors from external moisture. Mention may be made, in order to form this layer, of glass, PMMA or any other polymer composition combining these characteristics.

Use may be made, in order to assemble the various layers, of any type of pressing technique, such as, for example, hot pressing, vacuum pressing or laminating, in particular heat laminating. The manufacturing conditions will be easily determined by a person skilled in the art by adjusting the temperature and the pressure to the flow temperature of the composition.

In order to manufacture the photovoltaic modules according to the invention, a person skilled in the art can refer, for example, to the *Handbook of Photovoltaic Science and Engineering*, Wiley, 2003.

The present invention will now be illustrated by examples demonstrating the advantages of the present invention. It is specified that these examples are not under any circumstances aimed at limiting the scope of the present invention.

EXAMPLES

The following products were used to formulate the examples of the invention and the comparative examples:

1020 FN 24: medium-density PE produced by Total Petrochemicals with a density equal to 0.922 g/cm$^3$ and with an MFI equal to 2.1/10 min (ASTM D1238, 190° C., 2.16 kg), the melting point of which is equal to 109° C.

M 3410 EP: medium-density metallocene PE produced by Total Petrochemicals with a density equal to 0.934 g/cm$^3$ and with an MFI equal to 0.9 g/10 min (ASTM D1238, 190° C., 2.16 kg), the melting point of which is equal to 124° C.

Lotader® 6200: copolymer of ethylene, of ethyl acrylate (6.5% by weight) and of maleic anhydride (2.8% by weight) produced by Arkema, having an MFI of 40 g/10 nm (ASTM D1238, 190° C., 2.16 kg) and a melting point equal to 102° C.

Glass: 3 mm sheets

Backsheet: multilayer PVF/PET/PVF film, the PVF surface of which is treated with a coating.

EVA: copolymer of ethylene and of vinyl acetate comprising 33% by weight of vinyl acetate, having an MFI of 45 g/10 nm (ASTM D1238, 190° C., 2.16 kg) and a melting point equal to 62° C.

In order to evaluate the properties of the various formulations according to the invention, films were extruded by the cast film technology in an OCS extruder having a screw speed of 85 revolutions/min. A bag mixture of the various components in the proportions of Table 1 is produced before the extrusion, this bag mixture being introduced into the hopper. The temperatures of the 4 heating zones are adjusted to approximately 125° C./125° C./125° C./133° C. and the molten formulation at the head of the extruder passes into a flat die at 125° C. which makes possible the formation of films with a thickness of approximately 0.5 mm on the cylinder at the extruder outlet.

Films of comparative EVA formulations are produced according to the same protocol.

TABLE 1

| Composition | Lotader AX8840 | Lotader 7500 | Lotader 6200 | 1020 FN24 | M3410 EP |
|---|---|---|---|---|---|
| 1 | | | 70 | | 30 |
| 2 | | | 50 | | 50 |
| 3 | | | 30 | | 70 |
| 4 | | | 50 | 50 | |

The results relating to the permeability of the films obtained are given in Table 2 (Moisture Vapour Transmission Rate—MVTR). The tests are carried out according to Standard DIN 53122 (method E, 23° C., 85% RH). The method consists in placing a dehydrating agent (anhydrous calcium chloride) in a dish covered with a film of the formulation to be evaluated. The assembly is sealed and placed in a ventilated chamber regulated with regard to temperature (23° C.) and relative humidity (85% RH). Periodic weighings make it possible to determine the amount of water vapour which diffuses through the film. The formulations were tested with regard to permeability without specific conditioning. For each formulation, 3 tests were carried out.

In order to evaluate the adhesiveness of the formulations, structures composed of 3 layers, glass/formulation/backsheet, were manufactured by pressing.

After a preliminary cleaning of the glass with alcohol, the structure comprising the successive layers of glass, of formulation and of backsheet is placed under a heating press of Collin P 400 P type.

The pressing conditions are as follows: beginning of pressing at 110° C. under 3 bar, temperature gradient at 4° C./min to increase the temperature to 150° C., maintenance under 3 bar at 150° C. for 15 min, then gradient at a rate of 8° C./min to lower the temperature to 110° C., followed by the removal of the finished structure and cooling to ambient temperature.

The adhesiveness of the formulation is evaluated by a 90° peel test according to Standard ISO 8510-1. The structure obtained is cooled to ambient temperature and its peel strength is measured 6 days after manufacture, it being stored at 23° C. and a relative humidity RH of 50%. 4 tests were carried out for each formulation. The peel strength and the appearance of the failure are also given in Table 2. An appearance of adhesive failure shows poorer adhesion than cohesive failure. The delaminating of the backsheet also shows excellent adhesion of the tie to the backsheet and to the glass.

TABLE 2

| Composition | MVTR (g · 25 μm/m$^2$ · 24 h) | Peel strength (N/15 mm) | Appearance of the failure |
|---|---|---|---|
| EVA | 400 | 2 | adhesive |
| 1 | 10 | 12.5 | adhesive |
| 2 | 7.95 | 19 | cohesive |
| 3 | 5.3 | 19 | adhesive and cohesive |
| 4 | 9 | 29.5 | delaminating of the backsheet |

All the formulations according to the invention show excellent values for permeability to water vapour and high peel strengths, in comparison with the EVA encapsulants conventionally used. These better properties allow them to better protect the photovoltaic panel from moisture while preventing the various layers from delaminating, which makes it possible to improve the lifetime of the photovoltaic modules.

In order to measure the creep strength, a test specimen having a length of 50 mm, a width of 4.15 mm and a thickness of 1 mm was produced for each sample under a heating press at 125° C. for 20 minutes.

A weight corresponding to a stress of 0.5 bar is applied to each test specimen at the base of the test specimen. The test specimens are placed in a controlled-temperature chamber. The test begins at 85° C. The creep is measured by noting if the test specimen breaks during the test or by measuring its possible elongation. If the test specimens do not break at this temperature, the test is reproduced at a temperature higher by 10° C. up to a maximum temperature of 125° C.

The creep results are given in Table 3.

TABLE 3

| Formulation | Creep results | | | | |
| | 85° C. | 95° C. | 105° C. | 115° C. | 125° C. |
|---|---|---|---|---|---|
| EVA | <1 min | | | | |
| 1 | OK | OK | OK | OK | 4 min |
| 2 | OK | OK | OK | OK | 5 min |
| 3 | OK | OK | OK | OK | 5 min |
| 4 | OK | OK | 5 min | | |

Notation OK: the test specimen in question withstands the temperature under consideration (no elongation under load after 15 minutes).

Notation of x min type: at this temperature, the test specimen keeps for only a few minutes. It creeps and then total failure occurs after x minutes.

Notation of el 120%, el 140%, and the like, type: at this temperature, the test specimen creeps at first, then the elongation remains constant and the test specimen does not break during the test.

The noncrosslinked formulations according to the invention exhibit a much better creep strength than EVA. This level of creep strength allows the formulations according to the invention to be used in photovoltaic panels without crosslinking. Another advantage of one form of the invention is the improved creep strength when the polyolefin A is a metallocene polyolefin.

The invention claimed is:

1. A film composition for use in a photovoltaic module as a backsheet or as an encapsulant, said composition is polyolefin-based and comprising with respect to the total weight of the composition:
from 1 to 99 Weight percent of polyethylene A having an ethylene whose level by weight is greater than or equal to 80%, wherein said polyethylene A is either a homopolymer consisting of ethylene monomer units, or a copolymer consisting of ethylene and one or more monomers is selected from the group consisting of propylene, 1-butene, 1-pentene, 3-methyl-1-butene, 1-hexene, 4-methyl-1-pentene, 3-methyl-1-pentene, 1-octene, 1-decene, 1-dodecene, 1-tetradecene, 1-hexadecene, 1-octadecene, 1-eicosene, 1-docosene, 1-tetracosene, 1-hexacosene, 1-octacosene and 1-triacontene;
From 99 to 1 weight percent of a polyolefin B, other than A, carrying a reactive functional group X chosen from carboxylic acid anhydrides and epoxides, and containing from 60 to 99 weight percent polyolefin.

2. The composition according to claim 1, wherein the other alpha-olefin of the polyethylene A is chosen from propylene, 1-butene, 1-hexene, 1-octene or 1-decene.

3. The composition according to claim 1, wherein said composition comprises from 10 to 75% by weight of polyethylene A, with respect to the total weight of the composition.

4. The composition according to one of the claim 1, wherein the functional group X is a carboxylic acid anhydride functional group.

5. The composition according to claim 1, wherein the functional group X is an epoxide functional group.

6. The composition according to claim 1, wherein the polyethylene A comprises a level by weight of ethylene of greater than or equal to 90%.

7. The composition according to claim 1, wherein the polyethylene A has a density greater than 0.92.

8. The composition according to claim 1, characterized in that polyolefin B comprises ethylene.

9. The composition according to claim 1, characterized in that the polyolefin B carrying the functional group X is an ethylene-alkyl(meth)acrylate-maleic anhydride copolymer.

10. The composition according claim 1, wherein said composition additionally comprises at least one of the additives selected from the group consisting of coupling agents, crosslinking agents, UV absorbents, inorganic fillers, plasticizers, colouring materials, optical brighteners and flame retardants.

11. Photovoltaic module comprising the film composition of claim 1.

12. Process for the manufacture of a module according to claim 11, comprising the steps of:
manufacturing the film composition of claim 1;
assembling the various constituents of the module with the said manufactured film as encapsulant and/or backsheet.

13. The composition according to claim 4, wherein the functional group X is a maleic anhydride functional group.

14. The composition according to claim 5, wherein the functional group X is glycidyl methacrylate.

15. The composition according to claim 7, wherein the polyethylene A has a density of greater than 0.93.

* * * * *